(12) United States Patent
Messer

(10) Patent No.: US 7,817,401 B2
(45) Date of Patent: Oct. 19, 2010

(54) SOLID STATE TESLA COIL SUIT

(75) Inventor: Jeffrey Messer, San Bernardino, CA (US)

(73) Assignee: Extremely Ingenious Engineering LLC, Orlando, FL (US)

( * ) Notice: Subject to any disclaimer, the term of this patent is extended or adjusted under 35 U.S.C. 154(b) by 275 days.

(21) Appl. No.: 12/152,977

(22) Filed: May 15, 2008

(65) Prior Publication Data

US 2008/0285201 A1      Nov. 20, 2008

Related U.S. Application Data

(60) Provisional application No. 61/004,373, filed on Nov. 27, 2007, provisional application No. 60/936,506, filed on Jun. 20, 2007, provisional application No. 60/930,221, filed on May 15, 2007.

(51) Int. Cl.
    *H01T 23/00* (2006.01)
(52) U.S. Cl. .................................. 361/232; 361/231
(58) Field of Classification Search ................ 361/231, 361/232; 42/1.08; 102/502
    See application file for complete search history.

(56) References Cited

U.S. PATENT DOCUMENTS

| | | |
|---|---|---|
| 514,168 A | 2/1894 | Tesla |
| 593,138 A | 11/1897 | Tesla |
| 645,576 A | 3/1900 | Tesla |
| 649,621 A | 5/1900 | Tesla |
| 685,953 A | 11/1901 | Tesla |
| 685,954 A | 11/1901 | Tesla |
| 685,955 A | 11/1901 | Tesla |
| 685,956 A | 11/1901 | Tesla |
| 685,957 A | 11/1901 | Tesla |
| 685,958 A | 11/1901 | Tesla |
| 787,412 A | 4/1905 | Tesla |
| 1,119,732 A | 12/1914 | Tesla |
| 2,205,204 A | 6/1938 | King |
| 3,432,664 A | 3/1969 | Robison |
| 3,758,869 A | 9/1973 | Wagner |
| 3,781,647 A | 12/1973 | Glaser |
| 3,909,736 A | 9/1975 | Huchital et al. |
| 4,379,253 A | 4/1983 | Myer |
| 4,485,426 A * | 11/1984 | Kerls .......................... 361/232 |
| 4,685,047 A | 8/1987 | Phillips, Sr. |
| 4,717,889 A | 1/1988 | Engelmann |
| 4,727,297 A | 2/1988 | Wolze |

(Continued)

OTHER PUBLICATIONS

International Preliminary Report for PCT/US2008/007655 dated Jan. 7, 2010.

(Continued)

*Primary Examiner*—Danny Nguyen
(74) *Attorney, Agent, or Firm*—Milbank Tweed Hadley & McCloy LLP

(57) ABSTRACT

A wearable suit apparatus incorporating one or more user-operated solid state tesla coils includes a full body clothing article constructed of integrated, conductive shielding material. An on board power supply such as a battery pack powers the one or more solid state tesla coils, which are connected to the suit such that the entire suit is held at or near the same potential as the base of the secondary coil(s) of the SSTC(s), thereby protecting the wearer from injury from the high voltage.

2 Claims, 1 Drawing Sheet

U.S. PATENT DOCUMENTS

| | | | |
|---|---|---|---|
| 4,872,100 A | 10/1989 | Diaz | |
| 4,916,379 A | 4/1990 | Wand et al. | |
| 4,937,832 A | 6/1990 | Rocca | |
| 4,945,721 A | 8/1990 | Cornwell et al. | |
| 4,956,579 A | 9/1990 | Albright | |
| 4,963,792 A | 10/1990 | Parker | |
| 5,103,366 A | 4/1992 | Battochi | 361/232 |
| 5,173,643 A | 12/1992 | Sullivan et al. | |
| 5,225,623 A | 7/1993 | Krasnow | 89/1.1 |
| 5,276,281 A | 1/1994 | Sato et al. | |
| 5,281,898 A | 1/1994 | Albright | |
| 5,739,997 A | 4/1998 | Gross | |
| 5,818,180 A | 10/1998 | Canclini | |
| 5,841,239 A | 11/1998 | Sullivan et al. | |
| 5,864,212 A | 1/1999 | Sullivan | |
| 6,052,017 A | 4/2000 | Pidutti et al. | |
| 6,118,229 A | 9/2000 | Lee | |
| 6,166,869 A | 12/2000 | Pidutti et al. | |
| 6,198,335 B1 | 3/2001 | Pakriswamy | |
| 6,259,305 B1 | 7/2001 | Pakriswamy | |
| 6,272,694 B1* | 8/2001 | Weaver et al. | 2/456 |
| 6,320,508 B1 | 11/2001 | Giesler et al. | |
| 6,522,089 B1 | 2/2003 | Duong et al. | |
| 6,549,044 B2 | 4/2003 | Brambilla et al. | |
| 6,798,716 B1 | 9/2004 | Charych | |
| 6,883,509 B2 | 4/2005 | Porter et al. | |
| 6,906,486 B2 | 6/2005 | Berroth et al. | |
| 6,906,495 B2 | 6/2005 | Cheng et al. | |
| 6,911,848 B2 | 6/2005 | Vinciarelli | |
| 6,930,893 B2 | 8/2005 | Vinciarelli | |
| 6,934,166 B2 | 8/2005 | Vinciarelli | |
| 6,961,227 B1* | 11/2005 | Whiton et al. | 361/232 |
| 7,027,311 B2 | 4/2006 | Vanderillie et al. | |
| 7,235,945 B2 | 6/2007 | Correa et al. | |
| 7,400,487 B1 | 7/2008 | Bitar | 361/232 |
| 2003/0011324 A1 | 1/2003 | Lee | |
| 2004/0248742 A1 | 12/2004 | Terashima et al. | |
| 2005/0046387 A1 | 3/2005 | Aker et al. | |
| 2005/0083059 A1 | 4/2005 | Morita et al. | |
| 2005/0148864 A1 | 7/2005 | Slade et al. | |
| 2005/0184689 A1 | 8/2005 | Maslov et al. | |
| 2006/0098378 A1 | 5/2006 | Gross | 361/230 |
| 2006/0228548 A1 | 10/2006 | Ayai et al. | |
| 2007/0018629 A1 | 1/2007 | Potvin et al. | |
| 2007/0075053 A1 | 4/2007 | Smith et al. | |
| 2007/0145018 A1 | 6/2007 | Smith et al. | |
| 2007/0195561 A1 | 8/2007 | Suenaga et al. | |
| 2007/0222426 A1 | 9/2007 | Waffenschmidt et al. | |
| 2007/0263415 A1 | 11/2007 | Jansen et al. | |

OTHER PUBLICATIONS

Miniature Vacuum Tube Tesla Coil, Last Accessed, Nov. 17, 2009, www.capturedlightnin•g.org/hot-streamer/electrontube/minivttc.htm.
U.S. Appl. No. 12/288,586, filed Oct. 21, 2008, Issa, et al.
U.S. Appl. No. 12/152,545, filed May 15, 2008, Messer.
U.S. Appl. No. 12/152,525, filed May 15, 2008, Messer.
U.S. Appl. No. 12/313,792, filed Nov. 25, 2008, Issa, et al.
U.S. Appl. No. 12/214,655, filed Jun. 20, 2008, Issa.
U.S. Appl. No. 12/152,977, filed May 15, 2008, Messer.
U.S. Appl. No. 60/930,221, filed May 15, 2007, Messer, et al.
U.S. Appl. No. 60/936,506, filed Jun. 20, 2007, Messer, et al.
U.S. Appl. No. 61/004,373, filed Nov. 27, 2007, Messer, et al.
Tracy V. Wilson, How Wireless Power Works, www.howstuffworks.com, Nov. 20, 2008.
Minoru Watanabe, et al. A Study on High Temperature Superconductin Coil of Different Coil Arrangements, IEEE Transactions on Applied Superconductivity, Jun. 2007, vol. 17 No. 2.
Power Requirements for Cooling versus Temperature in Kelvin,www.metox.biz/super_roadmap, Jun. 8, 2008.
Cryostat, Wikipedia Encyclopedia,Jun. 1, 2008.
Resonator, Wikipedia Encyclopedia, Jun. 3, 2008.
Zenergy Receives Order for HTS Induction Heater, Semiconductor Week, Oct. 15, 2008, vol. 21 No. 18, Peregrine Communications.
Superconductivity Roadmap, www.metox.biz/super_roadmap, Jun. 8, 2008.
Miyagi, et al., AC Loss Characteristics of an assembled conductor of round Bi2223 Ag sheated wires, Elsevier Science B.V., Aug. 2002, vol. 372-376 Part 3 pp. 1727-1729.
Daumling, et al., Ac loss in superconducting power cables, Studies of High Temperature Superconductors, vol. 33, 2000.
O'Miura, et al, The development of a 2.5 T/100 kV A AC superconducting magnet using a high-J NbTi superconducting wire having Nb artificial pins, Supercond. Sci. Techno. Oct. 1993.
HTS-110 Leaders in HTS Magnetic Solutions, www.hts-110.co.nz, Jun. 8, 2008.
Michael Walker, et al., Performance of Coils Wound from Long Lengths of Surface-Coated, Reactedm BSCC0-2212 Conductor, IEEE Transactions on Applied Supercond. Jun. 1997, vol. 7 No. 2.
K. Hayashi, et al., Development of Ag-Sheated Bi2223 Superconducting Wires & Thier Applications, IEEE Transactions on Applied Superconductvity, Mar. 2001, vol. 11 No. 1.
A.B. Sneary,et al., Development og High Temperature Superconducting Coils Using Bi-2223/Ag Tapes, IEEE Transactions on Applied Superconductivity vol. 9 No. 2, Jun. 1999.
Mark S. Newson, et al., Progress on the Design and Operation of High-Tc Coils Using Dip-Coat BSCCO-2212/Ag Tape, IEEE Transactions on Applied Superconductivity, vol. 12 No. 1, Mar. 2002.
L. Bigoni, et al., Development of Bi-2223/Ag Tapes and Coils, IEEE Transactions on Applied Superconductivity, vol. 7 No. 2, Jun. 1997.
Pradeep Halder, et al., Developement of Bi-2223 HTS High Field Coils and Magnets, IEEE Transactions on Applied Superconductivity, Jun. 1995, vol. 5 No. 2.
PJ Masson, et al., HTS Machines as enabling technology for all-electric airborne vehicles, Superconductor Science & Technology, 2007, 748-756.
M. Ariante. et al., Characteristics of Coils wound with Mono and Multifilamentary Bi-2212/Ag from 4 to 80 K, IEEE Transactions on Magnetics vol. 32 No. 4, Jul. 1996.
Alexander Ilyusheckin, et al., Continuous Production of Bi-2212 Thick Film on Silver Tape, IEEE Transactions on Applied Superconductivity, vol. 9 No. 2, Jun. 1999.
Shinichi Nomura, et al., Helically Wound Coils for High Field Magnets, IEEE Transactions on Applied Superconductivity, vol. 14 No. 2, Jun. 2004.
Dan Combine, Radiant Energy and Over-Unity, Version 6, Oct. 2006.
Tomorrow's High-Temperature Superconducting Cables, www.innovations-report.com, Jun. 27, 2001.
Material Safety Data Sheet for SCS4050, SF12050, SF12100; High Temperature Superconductor Tape, Jun. 12, 2007, SuperPower Inc.
International Search Report for PCT/US2008/12013 dated Feb. 4, 2009.
International Search Report for PCT/US2008/06239 dated Aug. 26, 2008.
International Search Report for PCT/US2008/06176 dated Sep. 17, 2008.
International Search Report for PCT/US2008/13097 dated Feb. 4, 2009.
International Search Report for PCT/US2008/07655 dated Sep. 25, 2008.
Wireless Power Tesla Coil Demo, Last Accessed Sep. 14, 2009, http://www.youtube.com/watch?v=aG-We7A-i9U.
Mar. 15, 2010 Nonfinal Rejection for U.S. Appl. No. 12/152,976.
Issa, Anthony, Wireless Power Bus with Data Channel, Extremely Ingenious Engineering, LLC, Mar. 2009.
Information about Principal Investigators/Project Directors and co-Principal Investigators/co-Project Directors.
Page, Lewis, Lightning-gun tech approaching weaponisation, www.theregister.co.uk, Aug. 26, 2009.
Tobias, John, Experimental Studies of Wave Propagation in Three-Dimensional Photonic Crystals, Apr. 2002.
Tobias, John and Grebel H., Self-Imaging in photonic crystals in a subwavelength range, Optice Letters, Dec. 1, 1999, vol. 24, No. 23.

Tobias, John, Ajgaonkar M., Grebel H., Morphology-dependent transmission through photonic crystals, J. Opt. Soc.Am.B., Mar. 2002, vol. 19, No. 3.

Qels 2002, Tuesday Afternoon.

* cited by examiner

SOLID STATE TESLA COIL SUIT

CROSS REFERENCE TO RELATED APPLICATIONS

This application claims the benefit of U.S. Provisional Application Ser. No. 60/930,221, filed May 15, 2007; U.S. Provisional Application Ser. No. 60/936,506, filed Jun. 20, 2007; and U.S. Provisional Application Ser. No. 61/004,373, filed Nov. 27, 2007.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates generally to high voltage electronics, and more particularly to an improved wearable suit apparatus incorporating one or more solid state tesla coils.

BACKGROUND INFORMATION AND DISCUSSION OF RELATED ART

U.S. Pat. No. 4,753,088 to Harrison, et al. discloses mesh knit fabrics having electrically conductive filaments for use in manufacture of anti-static garments and accessories. The open mesh warp knit fabric of the present invention includes a base fabric knit with electrically nonconductive base yarn and forming an open mesh pattern of lightweight construction having spaced openings to provide ventilation therethrough. Electrically conductive filaments are incorporated in the base fabric and provide an open grid extending throughout the entire area of the base fabrics with the conductive filaments being incorporated predominantly in only one side of the base fabric. The conductive yarns provide only about one-half of one percent of the total weight of the fabric and are of a relatively fine denier so that the conductive yarn is substantially invisible to the naked eye. Various types of garments and accessories are illustrated as being formed of the electrostatic dissipating fabric.

U.S. Pat. No. 5,103,504 to Dordevic describes textile fabric shielding electromagnetic radiation, and clothing made thereof. The textile fabric is made of threads spun of textile fibers, containing cotton, and of steel fibers having a diameter of 6 to 10 .mu.m. The number of mixed yarn threads in warp direction and in weft direction each is 18 to 20 threads per cm, and the yarn fineness of the textile fabric is especially 38 to 40 tex. The textile fabric guarantees a shielding of 20 to 40 dB against electromagnetic radiation at a frequency of 10 GHz. The fabric has the quality of usual clothing, and the clothing thereof is designed with respect to proportions, seams, fasteners, and other special features in a manner such that especially people wearing pacemakers, or hospital and radar personnel, are protected against electromagnetic radiation.

U.S. Pat. No. 5,802,607 to Triplette teaches fencing jackets made from electrically conductive threads. A garment for use in electronically-scored, contact-sports competitions is described. The garment is in the form of a fencing jacket or vest, is substantially wireless, and is woven from electrically conductive threads which cooperate with an electric sports implement to register a score when the implement contacts the electrically conductive garment. The fabric can be woven with the electrically-conductive threads extending in only one of the warp and weft directions, and preferably only in the weft direction.

U.S. Pat. No. 5,906,004 to Lebby, et al. discloses a textile fabric including a plurality of electrically conductive fibers characterized as providing sufficient current to induce either a wired or wireless coupling between the textile fabric and a portable electronic device. The textile fabric is intended for fabrication into a functional article of clothing or other item made of the woven textile fabric, so as to increase functionality of the article of clothing or item made thereof. The plurality of electrically conductive fibers are characterized as creating an interconnect to a portable electronic device, including integrated components, electronics, or the like, or serving as an antenna for signals received and transmitted by the portable electronic device.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

SUMMARY OF THE INVENTION

The Solid State Tesla Coil (SSTC) Suit of the present invention provides a wearable suit apparatus incorporating one or more user-operated solid state tesla coils. The inventive apparatus comprises a full body clothing article constructed of integrated, conductive shielding material (e.g. metal mesh pants, jacket, hood, boots, etc.). An on board power supply (such as a DC battery pack) powers the one or more solid state tesla coils, which are connected to the suit such that the entire suit is held at or near the same potential as the base of the secondary coil(s) of the SSTC(s), thereby protecting the wearer from injury from the high voltage.

The secondary coil(s) and discharge electrode(s) are preferably carried on the arms of the conductive suit, so that the wearer may orient and aim the discharge electrode(s) to direct the sparks (lightning) generated by the coils in any desired direction. In this manner, the inventive suit can be used in applications such as crowd control. The suit also affords the wearer with protection against directed energy weapons.

In addition to providing adequate conductivity, the inventive conductive clothing preferably also provides flame retardancy, wear resistance, ease of cleaning and maintenance, and wearer acceptance and comfort.

It is therefore an object of the present invention to provide a new and improved conductive suit.

It is another object of the present invention to provide a new and improved wearable suit apparatus incorporating one or more user-operated solid state tesla coils.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
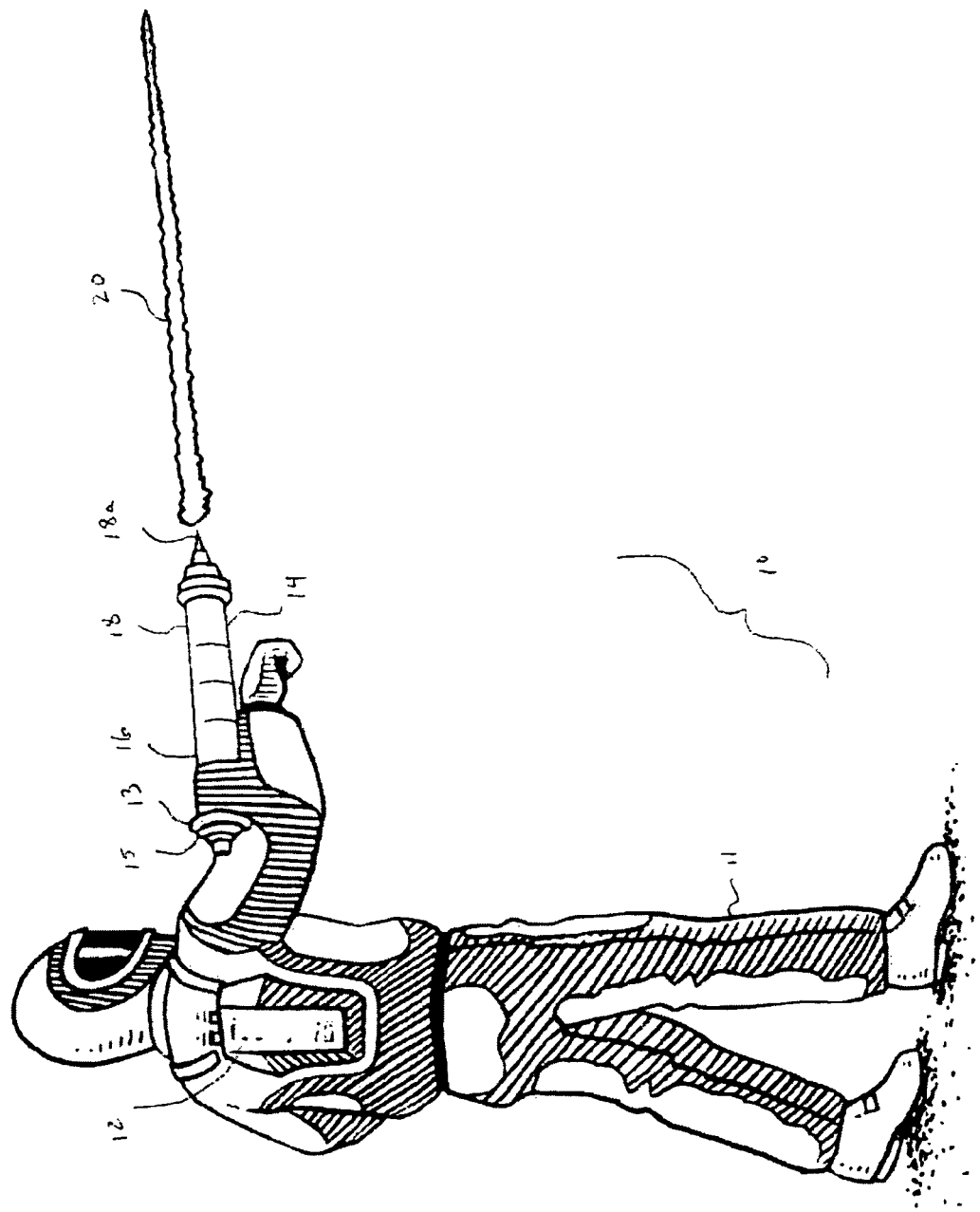
FIG. 1 is a schematic view of a solid state tesla coil suit apparatus of this invention.

Referring to FIG. 1, there is illustrated therein a new and improved solid state tesla coil suit apparatus, generally denominated 10 herein.

The inventive apparatus 10 comprises a full body clothing article 11 constructed of integrated, conductive shielding material (e.g. metal mesh pants, jacket, hood, boots, etc.). An on board power supply such as a DC battery pack 12 provides DC power to the high frequency bridge 15 for the primary coil 13 of one or more solid state tesla coils 14 carried on the suit 10. The tesla coil(s) 14 are connected to the suit 10 such that the entire suit is held at or near the same potential as the grounded base 16 of the secondary coil(s) 18 of the SSTC(s), at or near ground level.

The secondary coil(s) 18 and their respective discharge electrode(s) 18a are preferably carried on the arms of the conductive suit 10, so that the wearer may orient and aim the discharge electrode(s) 18a to direct the sparks (lightning) 20 generated by the coils in any desired direction.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A solid state tesla coil suit apparatus comprising:
    a full body clothing article constructed of conductive shielding material;
    a power supply carried on said clothing article; and
    at least one solid state tesla coil carried on said clothing article and connected to said power supply, said clothing article connected to the base or ground of said solid state tesla coil secondary coil so that said clothing article is held at or near the same potential as the grounded base of the secondary coil.

2. The solid state tesla coil suit apparatus of claim 1 wherein said full body clothing article includes an arm portion, and said at least one solid state tesla coil is carried on said arm portion.

* * * * *